United States Patent
Mori et al.

(10) Patent No.: US 7,442,651 B2
(45) Date of Patent: Oct. 28, 2008

(54) PLASMA ETCHING METHOD

(75) Inventors: Masahito Mori, Tokorozawa (JP);
Toshiaki Nishida, Kudamatsu (JP);
Naoshi Itabashi, Hachioji (JP);
Motohiko Yoshigai, Hikari (JP);
Hideyuki Kazumi, Hitachinaka (JP);
Kazutami Tago, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 11/354,919

(22) Filed: Feb. 16, 2006

(65) Prior Publication Data
US 2007/0134922 A1    Jun. 14, 2007

(30) Foreign Application Priority Data
Dec. 8, 2005 (JP) .............................. 2005-355092

(51) Int. Cl.
*H91L 21/302* (2006.01)
(52) U.S. Cl. .................. 438/714; 438/720; 438/722; 438/734; 438/740
(58) Field of Classification Search .................. 438/714, 438/720, 722, 734, 740
See application file for complete search history.

(56) References Cited

U.S. PATENT DOCUMENTS

| 6,069,035 A * | 5/2000 | O'Donnell et al. ........... 438/220 |
| 6,207,580 B1 * | 3/2001 | Costaganna .................. 438/712 |
| 6,284,146 B1 * | 9/2001 | Kim et al. ...................... 216/6 |
| 6,339,206 B1 * | 1/2002 | Johnson .................. 219/121.43 |
| 6,531,404 B1 * | 3/2003 | Nallan et al. ................. 438/714 |
| 6,821,907 B2 * | 11/2004 | Hwang et al. ............... 438/709 |

FOREIGN PATENT DOCUMENTS

| JP | 2004-519838 | 7/2004 |
| JP | 2004-356576 | * 12/2004 |
| KR | 1998-068710 | 10/1998 |
| KR | 2004-0101454 | 12/2004 |

OTHER PUBLICATIONS

Search Report/Office Action issued on Feb. 27, 2007 for Korean Application No. 10-2006-0015666.
English language translation of Search Report/Office Action for Korean Application No. 10-2006-0015666, issued Feb. 27, 2007.

* cited by examiner

*Primary Examiner*—George A. Goudreau
(74) *Attorney, Agent, or Firm*—Antonelli, Terry, Stout & Kraus, LLP.

(57) ABSTRACT

An etching technique capable of applying etching at high selectivity to a transition metal element-containing electrode material layer which is formed on or above a dielectric material layer made of a high-dielectric-constant or "high-k" insulator is provided. To this end, place a workpiece on a lower electrode located within a vacuum processing vessel. The workpiece has a multilayer structure of an electrode material layer which contains therein a transition metal element and a dielectric material layer made of high-k insulator. Then, while introducing a processing gas into the vacuum processing vessel, high-frequency power is applied to inside of the vacuum processing vessel, thereby performing plasma conversion of the introduced processing gas so that the workpiece is etched at its surface. When etching the electrode material layer, an HCl gas is supplied as the processing gas.

8 Claims, 10 Drawing Sheets

PLASMA ETCHING METHOD

FIELD OF THE INVENTION

The present invention relates generally to plasma etch methodology and, more particularly, to a plasma etching method suitable for etching a transition metal-containing gate electrode material or equivalents thereto.

BACKGROUND OF THE INVENTION

Figure 8:
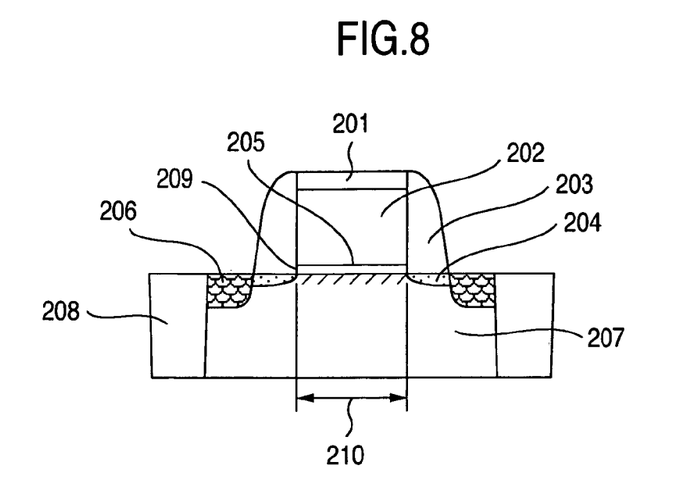
FIG. 8 depicts a cross-sectional structure of a prior known MOS transistor.

In recent years, ultralarge-scale integrated (ULSI) circuit devices for use in digital home electronics appliances, personal computers (PCs), mobile cellular phones and others are under requirements for higher integration and higher speed performance. Known basic circuit elements making up such ULSI devices are metal oxide semiconductor (MOS) transistors. See FIG. 8, which depicts a cross-sectional view of a prior known standard MOS transistor. As shown in FIG. 8, this transistor has a silicon (Si) substrate 207, a shallow trench isolation (STI) insulator 208 which is formed in a substrate surface for electrical separation between elements, a gate insulation film 205, a patterned gate electrode 202, sidewall spacers 203, and low resistance layers 206 which are formed by ion implantation on the opposite sides of the gate electrode and which function as source and drain regions.

The gate insulator film 205 may typically be an $SiO_2$ or SiON film, whereas the gate electrode 202 is made of ion-doped polycrystalline silicon (poly-Si). Regarding respective regions of the gate electrode 202 and source/drain 206 along with extension regions 204 and a channel 209, the carrier mobility of the channel and the gate electrode's work function plus electrical resistivities are controllable by appropriately varying the species and dose of dopant ions and also changing anneal conditions after ion implantation. Whereby, it is possible to fabricate N-channel MOS (NMOS) and P-channel MOS (PMOS) transistors on the same Si substrate while suppressing the so-called "short channel" effect.

A size 210 of the gate electrode 202 of the MOS transistor having the above-stated structure is a critical dimension (CD), so it becomes necessary to microfabricate it with high precision. A currently available common approach to forming the gate electrode 202 is to employ a method having the steps of forming a film of electrode material, depositing thereon a resist film, exposing a circuit pattern, and applying dry etching thereto.

An approach to achieving the dry etching is to use a method for converting a reactive gas into a plasma by electromagnetic waves or else and utilizing ion-assisted reaction due to ions and neutral radicals in the plasma. Several types of apparatus used for the dry etching are known, including etcher tools of the capacitive coupled plasma (CCP) type, inductive coupled plasma (ICP) type and electron cyclotron resonance (ECR) type, which are different from one another in plasma creation mechanism. The electromagnetic waves for use with the CCP and ICP etchers are set to 13.56 and 27 MHz, respectively; ECR etcher is designed to use microwaves with a frequency of 2.45 GHz or alternatively ultra-high frequency (UHF) waves of about 450 MHz.

The dry etching apparatus is equipped with a reactive gas introduction mechanism, a plasma processing pressure controlling mechanism, a lower-electrode mechanism for mounting a Si wafer with a to-be-etched film being formed thereon, a Si wafer conveyance/transfer mechanism, and a control module for controlling operation timings of these mechanisms. The lower-electrode mechanism includes an electrostatic chuck (ESC) unit for immovably holding the Si wafer, a Si wafer temperature control unit, and a radio frequency (RF) bias applying unit for attraction and indraft of ions in a plasma.

In the etching apparatus with the above-noted mechanisms, in order to accurately control the size (CD) of gate electrode, it is required to adjust several system parameters (parameter set), such as the kind of a reactive gas, a processing pressure, an output power of electromagnetic wave for plasma creation, a workpiece temperature, an RF bias output power, etc. Consequently, not only in case the to-be-etched film is a multi-layered film but also in case this film is made of the same material, there is often performed a multi-step process which adequately switches between prespecified system parameter sets when processing nearby portions of its underlayer boundary or interface.

In the case of performing the multi-step processing, the timing of switching between steps is determined based on a change with time of light emission intensity of molecules or radicals in the plasma or a time change in film thickness interference light. For example, in case a single film is etched, basic steps are a main etching (M.E) for vertically processing most part of a material and over-etching (O.E) for removing residue film components, which steps are used while being switched alternately.

Incidentally, ULSI devices are required to offer low power consumption in addition to the requirements for high integration and high speed performance. A currently investigated means for realizing this low power consumption is as follows. In the case of the MOS transistor shown in FIG. 8 for example, the gate insulator film 205 is made of a specific material with its dielectric constant k being higher than that of $SiO_2$—known as "high-k" material. Examples of this high-k material are $ZrO_2$, $Y_2O_3$, $La_2O_3$, $LaAlO_x$, $LaSiO_x$, $Al_2O_3$, $HfO_2$, HfAlO(N), and HfSiO(N).

Additionally, in order to further enhance the integration and speed performance, it is also under review to employ a gate electrode using a metallic material (metal gate electrode) in place of the poly-Si gate electrode 202 which has difficulty in depletion-layer suppression. One known example is a p-channel MOS (PMOS) device of the type having a multi-layer structure of TaSiN and TiN plus $HfO_2$ films. Other examples are an NMOS device of the type having a multilayer of TaSiN and $HfO_2$ films, and a complementary MOS (CMOS) device having stacked W and SiON films with a TiN film interposed therebetween. As for the gate insulator film, there is known a device using HfSiON other than the traditional dielectric materials, such as $SiO_2$ and SiON.

The TiN, which is an expecting material for use as metal gate electrodes, has been traditionally used as a barrier layer of aluminum wiring leads in the form of a multilayer structure of a resist, TiN, Al, TiN and $SiO_2$ films. For etching the TiN film, a plasma has been used which is created using a $Cl_2$ gas with a $BCl_3$ gas or 3% of $CH_4$/Ar gas and/or fluorocarbon gas being added thereto. In this case, it is known that adding a F-based gas such as $CHF_3$ or else to the Cl-based gas such as $Cl_2$/$BCl_3$ results in an increase in etching rate of TiN.

In case the TiN that has been used in metal wiring processes as stated above is used for the gate electrode, a need is felt to perform the etching while realizing the required vertical shape and, at the same time, sufficiently retaining the selectivity relative to the underlying gate insulator film. An approach to attaining this process is disclosed in JP-A-2004-519838, which teaches a two-step etch technique for performing main etching by use of a $Cl_2$ or F-based gas ($CF_4$, $C_xH_yF_z$) during etching of a TiN/$HfO_2$ metal gate structure, and, after completion of the main etching of TiN, applying overetching to nearby portions of the underlayer interface by using a $Cl_2$/HBr gas.

SUMMARY OF THE INVENTION

Figure 9:
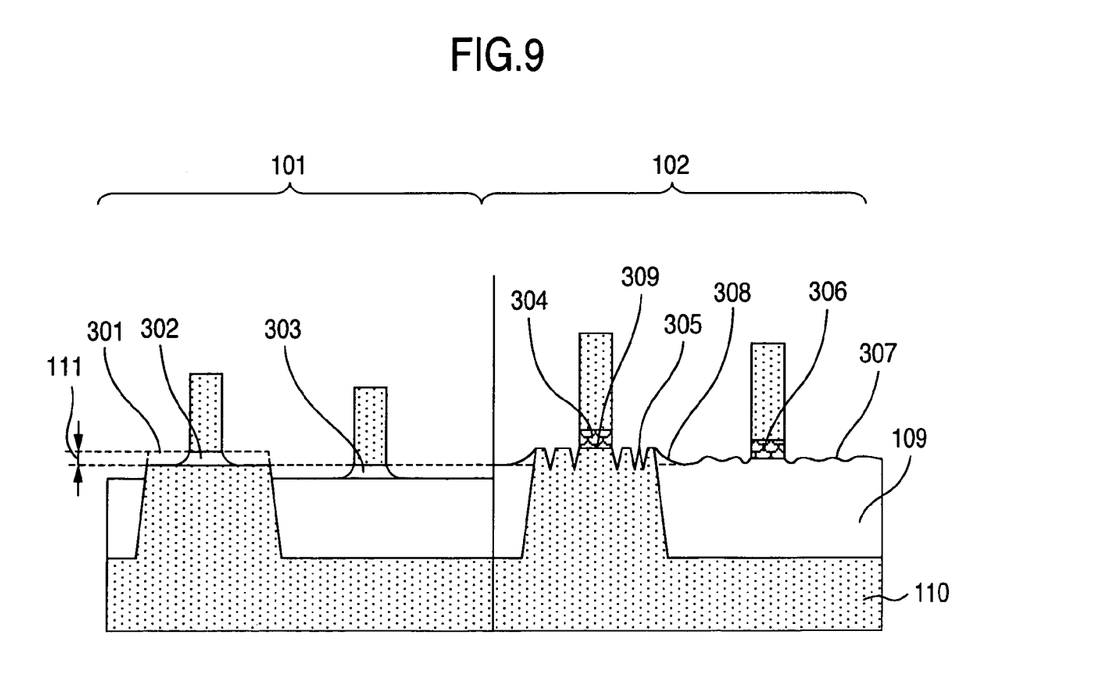
FIG. 9 is a diagram for explanation of an etching result of a metal gate part using a traditional $Cl_2$/HBr gas.

FIG. 9 is a diagram for explanation of etching results of metal gate (TiN layer 107) portions by application of the two-step etch method using a $Cl_2$/HBr gas, such as indicated in the above-identified Japanese Patent document, in the manufacture of the metal gate structure MOS transistor shown in FIG. 8.

Note that the etching conditions of TiN layer 107 are as follows. In the main etching step, a mixture ratio of $Cl_2$ to HBr is 4:1, a processing pressure is 0.2 Pa, an output power of UHF power supply is 500W, an output power of RF bias power supply is 15W, and an electrode temperature is 40° C. In the overetching step, RF bias is set to 10W, and a processing time period is a time required to etch about 30% of the film thickness of TiN layer 107.

As apparent from viewing FIG. 9, an NMOS part 101 shown herein experiences unwanted penetration or "punch-through" in an HfSiON film 108 at the both of a gate electrode portion 302 and a wiring lead 303 overlying STI insulator 109, resulting in occurrence of underlayer etch-away to a level reaching Si substrate 110. Alternatively in a PMOS part 102, a pin hole-like underlayer dislocation 305 is partially present at the underlying HfSiON film 309 at nearby locations of TiN gate electrode 304 having relatively large pattern density. At portions near or around a wiring lead 306 above STI with a relatively less pattern density, underlayer dislocation takes place at portions of a surface of the underlying HfSiON film 309, resulting in occurrence of roughened irregular surface configurations 307.

At a stair step-like height difference portion 111 of STI, a TiN residue 308 remains at its corner edge, which indicates that the etching amount is deficient with execution of 30%-equivalent overetching. Generally speaking, the overetching treatment time is determinable depending upon the step height deference of STI 111. For example, in case the STI step height difference is 15 nanometers (nm) and the TiN electrode 306 is 20 nm in thickness, an overetching time of more than 75% relative to the film thickness of TiN is required.

As taught from the above-cited document JP-A-2004-519838, when using the $Cl_2$/HBr gas for TiN etching of the metal gate, the selectivity against the underlying high-dielectric-constant or "high-k" film becomes lower. This results in occurrence of both the underlayer dislocation and TiN residue at NMOS and PMOS parts when processing is done for 30% of the overetching time, by way of example. Conclusively, it is difficult to fabricate the intended metal-gate CMOS device.

This invention has been made in view of the above-noted technical background, and its object is to provide an etching technique capable of applying etching with high selectivity to an electrode material layer, which contains therein a transition metal element(s) and which is formed on or above an electrically insulative layer that is made of a high dielectric constant k ("high-k") insulator.

To achieve the foregoing object, the invention employs the means which follows.

A plasma etching method includes the steps of placing on a lower electrode located within a vacuum processing vessel a workpiece that has a lamination of an electrode material layer containing therein a transition metal element and a dielectric material layer made of a high-dielectric-constant insulator, introducing a processing gas into the vacuum processing vessel, supplying high-frequency electrical power to inside of the vacuum processing vessel, and performing plasma conversion of the processing gas introduced to thereby apply etching treatment to a surface of the workpiece. When etching the electrode material layer, a hydrogen chloride (HCl) gas is applied as the processing gas.

Owing to the above-stated features of the invention, it is possible to provide the etching technique capable of etching with high selectivity an electrode material layer, which contains transition metal elements and which is formed to overlie an insulative layer made of high-k dielectric material.

DETAILED DESCRIPTION OF THE INVENTION

Figure 10A:
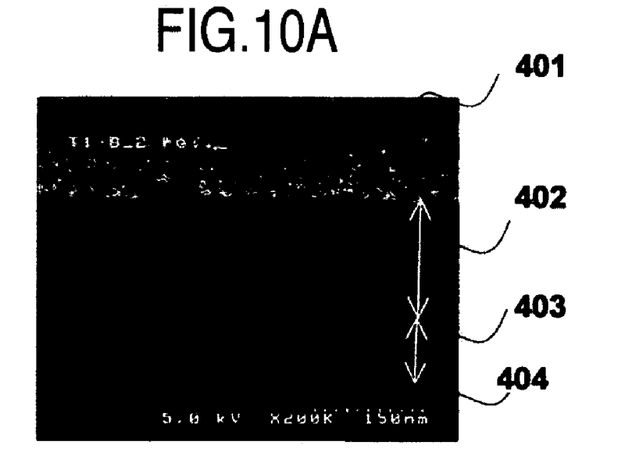
FIGS. 10A-10C are diagrams each showing a SEM photograph of a wafer surface.
Figure 10B:
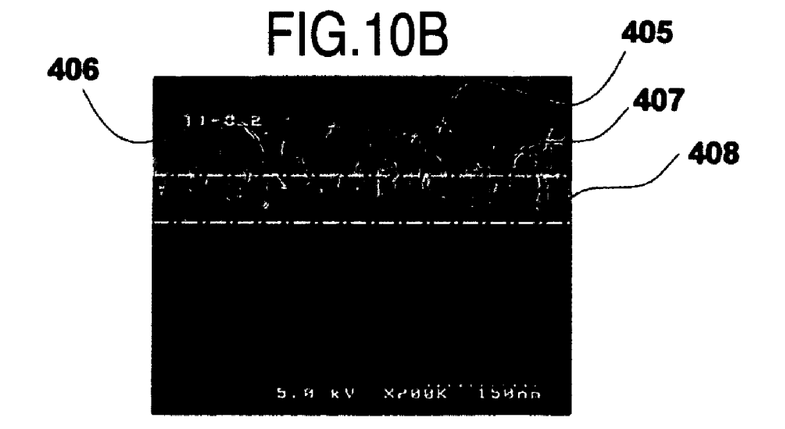
Figure 10C:
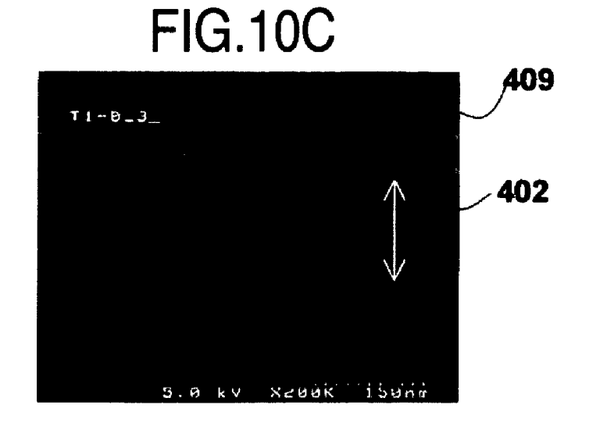

An explanation will first be given of the cause of occurrence of either the above-stated penetration or the surface roughness such as shown in FIG. 9. FIGS. 10A to 10C are diagrams showing scanning electron microscope (SEM) photographs of wafer surfaces, wherein FIG. 10A shows a stacked structure of TiN and $SiO_2$ films prior to etching, FIG. 10B shows a TiN/$SiO_2$ structure which was etched using a traditional gas system with a mixture ratio of $Cl_2$ to HBr being set at 4:1, and FIG. 10C shows a TiN/$SiO_2$ structure etched under a condition of HCl:HBr=4:1.

Comparing a TiN surface 401 before etching shown in FIG. 10A to a TiN surface 405 after etching shown in FIG. 10B, it can be seen that a myriad of needle-like residues 406 are present on the TiN surface after etching. In other words, when etching is applied to a multilayered film of TiN (electrode material that contains a transition metal) and HfSiON (high-dielectric-constant or "high-k" material) by using the traditional gas system, the presence of the needle residues of TiN causes the high-k material that immediately underlies a lower end portion 408 of needle residue to be greater in plasma exposure time than a surface portion 407 of needle residue, resulting in acceleration of occurrence of surface roughess and underlayer dislocations.

It is very likely that this phenomenon is caused by (1) local etching propagation at grain boundary faces or interfaces of TiN as resulted from intrusion or "invasion" of an etchant into Ti—N bonding-weak portions of such TiN grain interfaces due to the presence of $Cl_2$ in a way as suggested by International Symposium on Dry Process 2003, p. 105, or alternatively arises from the fact that (2) oxygen to be released from a certain amount (1 cc or less in flow rate conversion) of quartz components being used during vacuum processing behaves to form Ti—O bonds, thereby becoming a micromask.

Accordingly, as the means for resolving both the estimated causes (1) and (2) at a time, an attempt was made to perform etching while replacing the traditional $Cl_2$ gas with an HCl gas. More specifically, it is expected to obtain an effect that the use of the HCl gas results in production of an increased number of hydrogen radicals thereby causing weak bond portions at the TiN grain interface to terminate due to hydrogen or, alternatively, an effect of removing Ti—O bonds away from the surface by hydrogen's reduction action. Additionally, due to containment of chlorine atoms, it is expectable to provide the etching rate which is substantially equal to that in the case of a $Cl_2$ gas.

A result of SEM observation of the TiN surface using the HCl gas is shown in FIG. 10C. It is affirmed by this observation result that any needle-like residues 405 are absent on the TiN surface 401 after etching. It is also demonstrated that appreciable changes are rarely found with respect to the roughness of the TiN surface 401 prior to the etching.

Figure 11A:
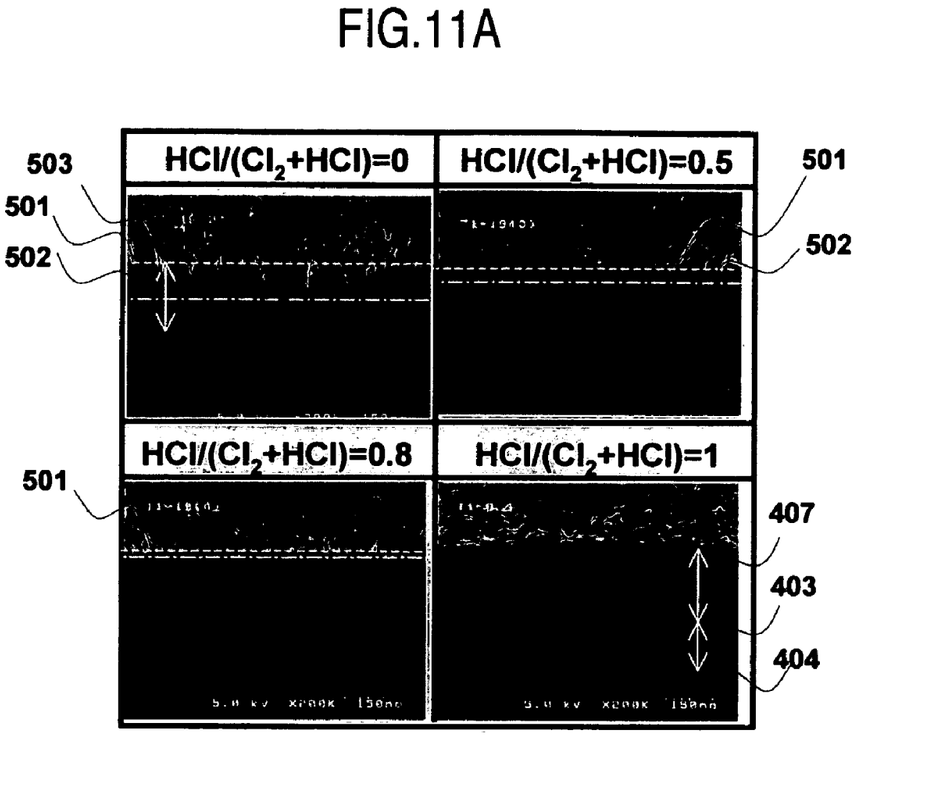
FIG. 11A is a diagram for explanation of a change in etching properties with a gas ratio (HCl/($Cl_2$+HCl)) varied; and, FIG. 11B is a graph showing plots of TiN etch rate versus HCl gas ratio.
Figure 11B:
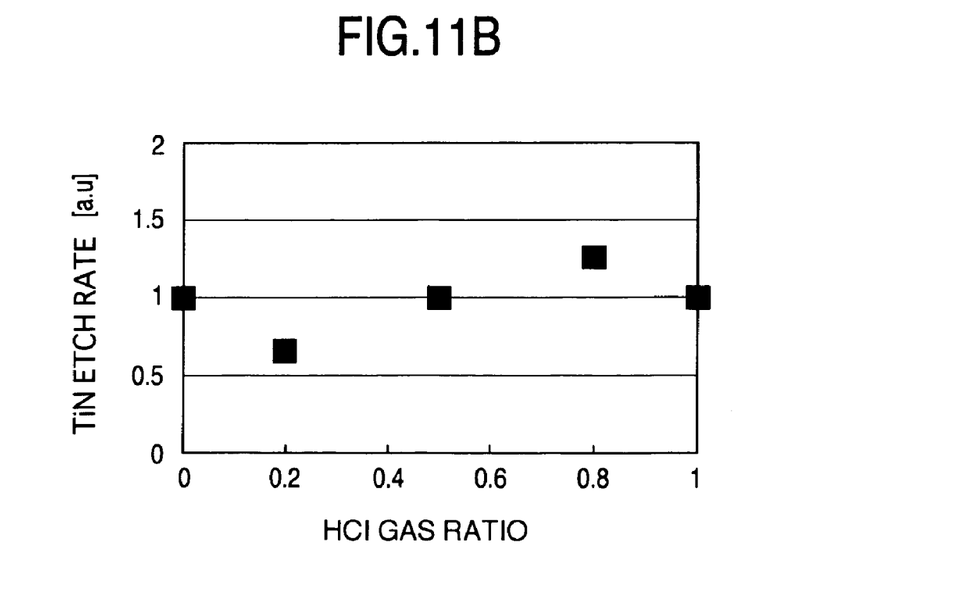

FIGS. 11A and 11B are diagrams for explanation of a state change in case the gas ratio (HCl/($Cl_2$+HCl)) is varied, wherein FIG. 11A is a SEM photograph of a wafer surface (TiN/$SiO_2$ structure) which is obtained per each gas ratio whereas FIG. 11B is a diagram showing the etching rate obtainable per each gas ratio.

As shown in FIG. 11A, it is apparent that the needle-like residues decrease in number with an increase in HCl gas ratio, resulting in a likewise decrease in difference between an upper surface 501 and lower face 502 of residues. Note here that the etching rate shown in FIG. 11B was calculated from a difference in film thickness values prior to and after the etching while letting a surface of residue film after etching being part of the upper residue face 501. As shown in FIG. 11B, it can be seen that the TiN etch rate is kept almost constant within an admissible variation range even when the HCl/$Cl_2$ ratio increases.

From the foregoing, it is evident that based on the finding that (1) it is the $Cl_2$ gas that causes surface roughness of TiN and (2) using the HCl gas in place of $Cl_2$ gases, it is possible to avoid needle-like residues of TiN while retaining the etch rate to a level equivalent to that in the case of using $Cl_2$ gases—furthermore, it is possible to eliminate surface damaging to its underlying surface.

Figure 12:
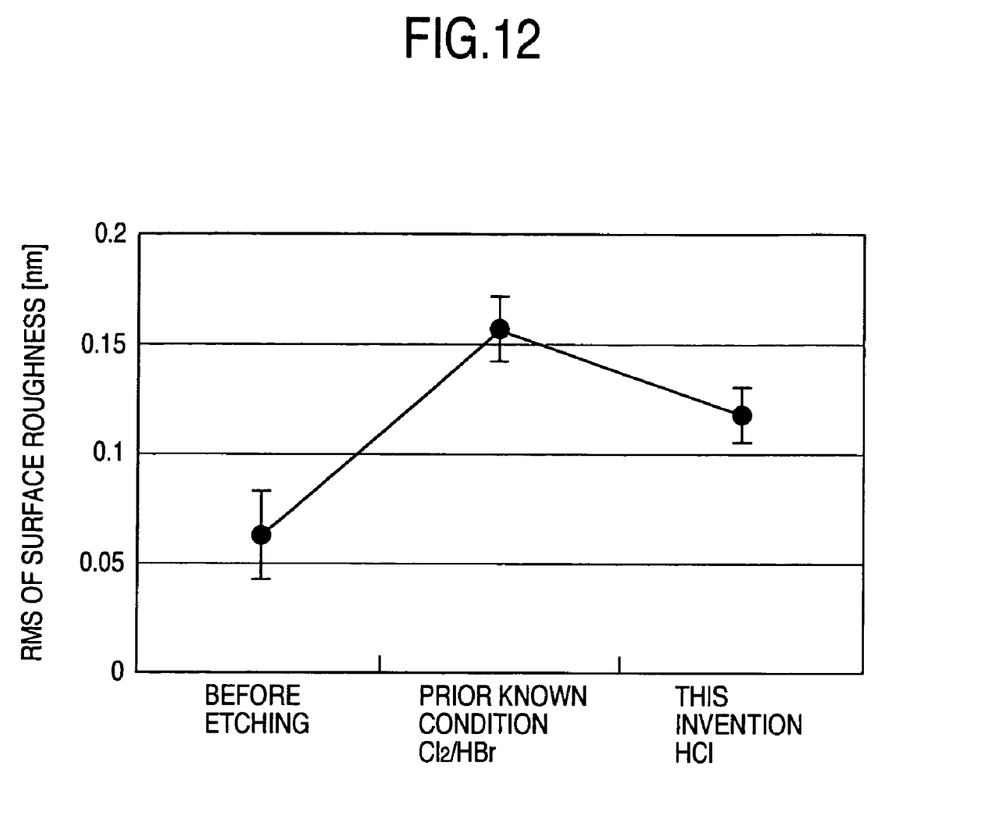
FIG. 12 is a graph showing the surface roughness of an underlying high-dielectric-constant material film as obtained per processing gas condition.

FIG. 12 is a graph showing the surface roughness (in root-mean-square or "RMS") of an undercoat film of high dielectric constant or "high-k" material, which is obtained per processing gas condition. The surface roughness was measured by an atomic force microscope (AFM). As shown in FIG. 12, in the case of using an HCl gas as the processing gas, it is possible to reduce the RMS of the surface roughness when compared to the traditional condition (i.e., using a $Cl_2$ gas). In other words, using the HCl gas as an alternative to the $Cl_2$ gas makes it possible to reduce or minimize the surface roughness relative to TiN (electrode material layer) and HfSiON (high-k material layer).

This effect was the same in regard to a case where a transition metal material (e.g., material that contains Ta or Mo) is used which forms chemical compounds similar to TiN.

It should be noted that in order to improve the underlayer selectivity, it is important to reduce physical damages against the underlying surface. For this physical damage reduction, a need is felt to lessen the energy of incoming ions from a plasma.

According to experimentation, it is possible to restrain such physical damages to thereby implement the intended overetching of more than 75% relative to the TiN film thickness, by using an HCl gas as the processing gas and by setting the RF bias to a low bias condition of less than 10W per 8 inches (i.e., 10W for a 8-inch diameter wafer: 30 $mW/cm^2$).

At this time, the energy of ions falling onto a workpiece, such as a semiconductor wafer or else, varies depending on the RF bias and plasma density. However, in the etching conditions stated above, a time average of incident ion energy was at 50V.

The above-noted experimentation revealed that the use of the HCl gas as the processing gas in place of $Cl_2$ gas makes it possible to suppress occurrence of needle-shaped residues upon etching of an electrode material layer which contains therein transition metal elements and which is formed on or above a dielectric material layer made of high-k insulator. It is also understandable that adjusting the RF bias to a lower level enables preclusion of underlayer dislocations while at the same time retaining the verticality of the etching.

Figure 1:
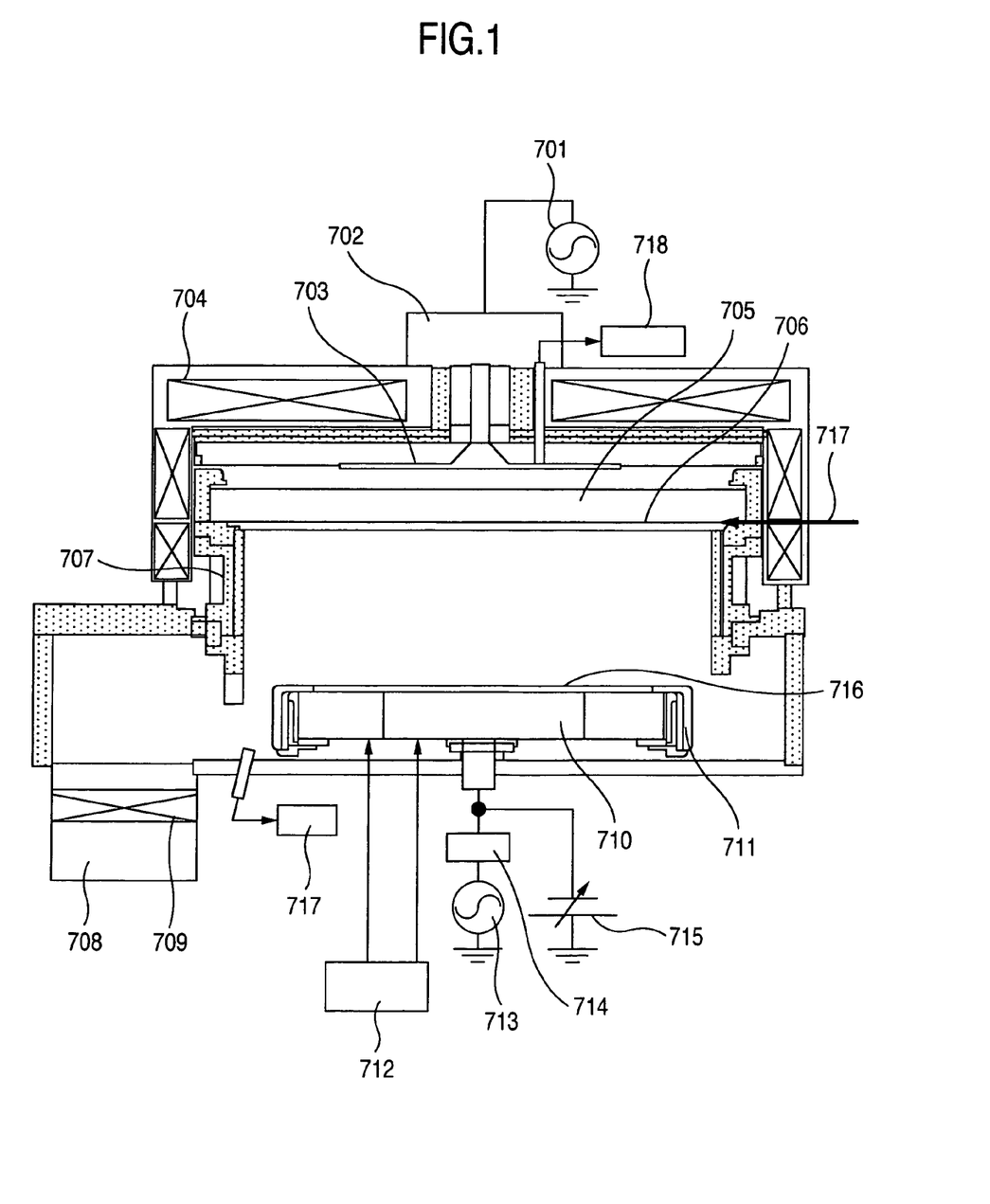
FIG. 1 is a diagram illustrating, in cross-section, an overall structure of a UHF-ECR plasma etching apparatus for use in an embodiment of this invention.

Referring now to FIG. 1, a UHF-ECR plasma etching apparatus for use in an embodiment of this invention is shown in cross-section. As shown in FIG. 1, this etcher has a plasma creation mechanism, which includes a UHF power supply 701 with its frequency of 450 MHz, a UHF matching unit 702, an antenna 703, and a three-staged electromagnet 704. The antenna 703 is operable to give off UHF waves into the inner space of an etching chamber 707 and is installed on the ambient air side external to a quartz plate 705 that maintains a vacuum.

An etching gas is such that its flow rate is appropriately adjusted under the control of a mass flow controller or the like. After having subjected to adequate gas mixture, the resulting gas is introduced into the interior of the etching chamber 707 through a gas inlet pipe 717 and a shower plate 706 and, thereafter, is exhausted by a high vacuum pump 708 together with etching reaction products and others. Note that a pressure during etching treatment is controllable to any desired value by causing an adjustable valve 709 to change the conductance of an exhaust air flow path.

A silicon (Si) wafer 716 for use as a workpiece to be etched is mounted on a lower electrode 710, which offers the supportability to various sized wafers having diameters of from 8 to 12 inches, through alteration of a susceptor 711. The lower electrode 710 is concentrically divided into a plurality of regions, each of which is controllable to a predetermined temperature by use of a circulator 712.

During etching, the wafer 716 is electrostatically adsorbed or sucked while supplying to a suction electrode a DC voltage of −1000 to +1000V, which is generated by a DC power supply 715. Additionally, in order to enhance thermal conduction efficiency, a He gas is filled into a gap space between wafer 716 and lower electrode 710, for controlling a pressure thereof. Also note that in order to control the energy of ions in a plasma, the lower electrode 710 includes an RF bias power supply 713 and a matching box 714, wherein the former has a frequency of 400 kHz to 13.56 MHz and is capable of applying an output power equivalent to 150W/8-inch in maximum.

Figure 2A:
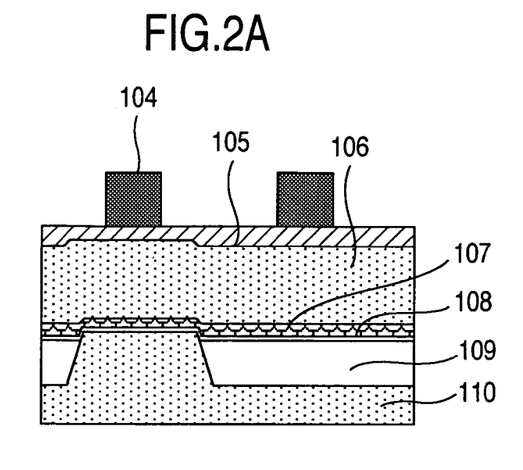
FIGS. 2A to 2C are diagrams each showing in cross-section an exemplary material to be etched (sample No. 1).
Figure 2B:
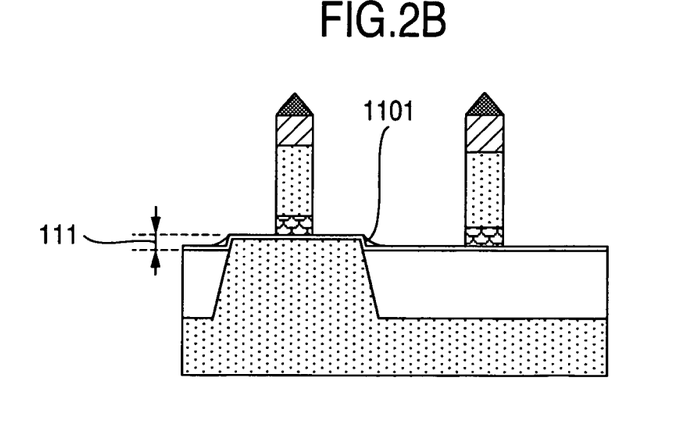
Figure 2C:
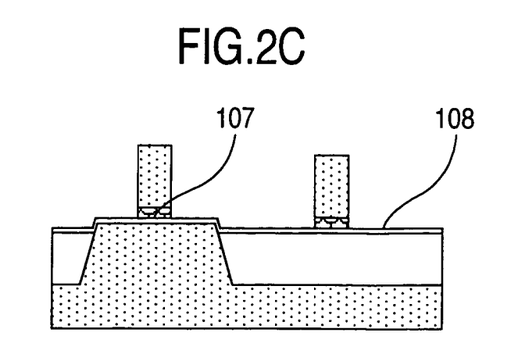

Turning to FIGS. 2A-2C, these diagrams are partial cross-sectional views of an example of the to-be-etched material (sample No. 1) which is processable by the etching apparatus shown in FIG. 1. The to-be-etched material has a Si substrate 110, an STI insulator 109 for element isolation as formed on the substrate 110, a gate insulating film 108 with a thickness of approximately 2 to 3 nm, which is made of HfSiON, HfSiO, $HfO_2$ or the like, a TiN layer (gate electrode material) 107, a poly-silicon layer 106 of about 100 nm thickness, an organic anti-reflective film 105, and a patterned ArF resist film 104.

An explanation will next be given of a method for using the etcher shown in FIG. 1 to etch by multiple-step processing techniques the sample 1 having the metal-gate structure shown in FIG. 2A within a single chamber. Firstly, main etching treatment of the anti-reflective film 105 was performed by supplying a mixture gas of a F-based gas and a gas which contains any one of $O_2$, HBr, Ar and $N_2$, while setting an output power of the UHF power supply 701 at 300 to 800W, setting a processing pressure at 0.8 to 3.0 Pa, setting an output power of the RF bias power supply 713 at 10 to 60W, setting a lower-electrode temperature (including multiple divided regions) at 0 to 80 degrees, and setting a magnetic flux distribution of the three-stage electromagnet 704 at an appropriate level.

An etching end point of the antireflective film 105 is determined as a point at which was dropped the light emission intensity of a wavelength of CN (387 nm) that was sensed by an optical emission spectroscope 717, thereafter followed by jumping to a main etching step of the next poly-Si layer 106 after having performed overetching for an optimal length of time period. The main etching step with respect to the poly-Si layer 106 was done in a way which follows: let the $Cl_2$, HBr or F-based gas be blended with an oxygen-containing gas; then, etching is done while setting the output power of UHF power supply 701 at 300 to 800W, the processing pressure at 0.2 to 0.8 Pa, the output power of RF bias power supply 713 at 10 to 40W, and the lower-electrode temperature at 0 to 80 degrees, respectively. Upon switching from the main etching step to the overetching step, either a film thickness interferometer 718 or the emission spectroscope 717 is used to determine the completion; then, go to the overetching step for removal of poly-Si residue components corresponding to STI stair-step like height difference portions of 0 to 50 nm.

The overetching conditions are set up so that a gas which contains $Cl_2$ or HBr and yet does not contain oxygen is blended, the output power of UHF power supply 701 was set at 300 to 800W, the processing pressure was set at 1.0 to 7.0 Pa, the output power of RF bias power supply 713 was set at 5 to 20W, the lower-electrode temperature was set at 0 to 80 degrees, and the three-stage electromagnet 704 was set so that its magnetic fluxes have an appropriate distribution. Additionally it is required that during such overetching, the poly-Si is processed in the absence of oxygen in light of the fact that TiN is readily bonded with oxygen, resulting in stoppage of etching, called the "etch stop."

Thereafter, etch the TiN layer. First, supply an HCl gas with a flow rate of 50 to 150 ccm and settings are done so that the output power of UHF power supply 701 is at 300 to 600W, the processing pressure is 0.1 to 0.4 Pa, the output power of RF bias power supply 713 is 5 to 15W, the lower-electrode temperature is 0 to 80 degrees, and the magnetic fluxes of three-stage electromagnet 704 have an adequate distribution. While the end point of the TiN etching is obtainable by measurement of a change with time of the plasma emission of reactive products of Ti or the film thickness interference, this example is such that a time change of 416 nm TiCl plasma emission was detected for switching the step at a time point at which the TiCl emission intensity begins to drop down. A cross-sectional view of the to-be-etched material immediately after completion of such step switching is shown in FIG. 2B.

As shown in FIG. 2B, it can be seen that TiN residues 1101 exist at the STI stair step-like height difference portions 111 (at bottom edges thereof). To remove these TiN residues 1101, overetching was continuously performed while letting the RF bias drop down to 0-10W. After completion of the overetching treatment, the ArF resist 104 and antireflective film 105 were removed away by ashing techniques. A cross-section of the to-be-etched material after the removal is shown in FIG. 2C.

As shown in FIG. 2C, the TiN residues 1101 of STI step difference portions 111 have been removed away. In this way, it was possible to vertically etch the TiN layer (gate electrode material) 107 successfully without having to exert bad influences, such as surface roughness and/or underlayer dislocations, on its underlying HfSiON (high-k material layer) 108.

Such effect and advantage are also obtainable when using other materials containing therein Ti, Ta, Ru or Mo, which is a transition metal that forms chemical compounds being similar in nature to TiN. It should be noted that although $SiO_2$ or SiON films are usable as the high-k material film, the advantage is significant with respect to those materials of higher dielectric constants than that of $SiO_2$, which are large in surfer roughness even immediately after completion of film fabrication and thus have the difficulty in establishing the underlayer selectivity, such as HfSiO or HfSiON or else.

In the case of preparing metal-gate CMOS transistor devices, a need is felt to remove the high-k material film after completion of the processing shown in FIG. 2B. To do this, a wet cleaning method or a method of combining together etching and wet cleaning processes is available. It is also possible to do it as part of the multi-step processing in a single etching apparatus. If this is the case, it is required that the selectivity against the underlying Si substrate 110 be sufficiently acquirable. An example of etching conditions in this case is as follows: a $BCl_3$ gas is used; the output power of UHF power supply 701 is set to 300 to 600W; the processing pressure is set at 0.1 to 0.4 Pa; the output power of RF bias power supply 713 is 0 to 10W; the lower-electrode temperature is 0 to 80 degrees; and, the three-stage electromagnet 704 is set so that its magnetic fluxes have an adequate distribution.

Although in this example a metal-gate structured workpiece having the poly-Si layer 106 was used as the sample, the TiN layer is etchable similarly even in cases where the poly-Si layer 106 is replaced by a layer of other materials, such as for example W/WN or equivalents thereof.

Figure 3A:
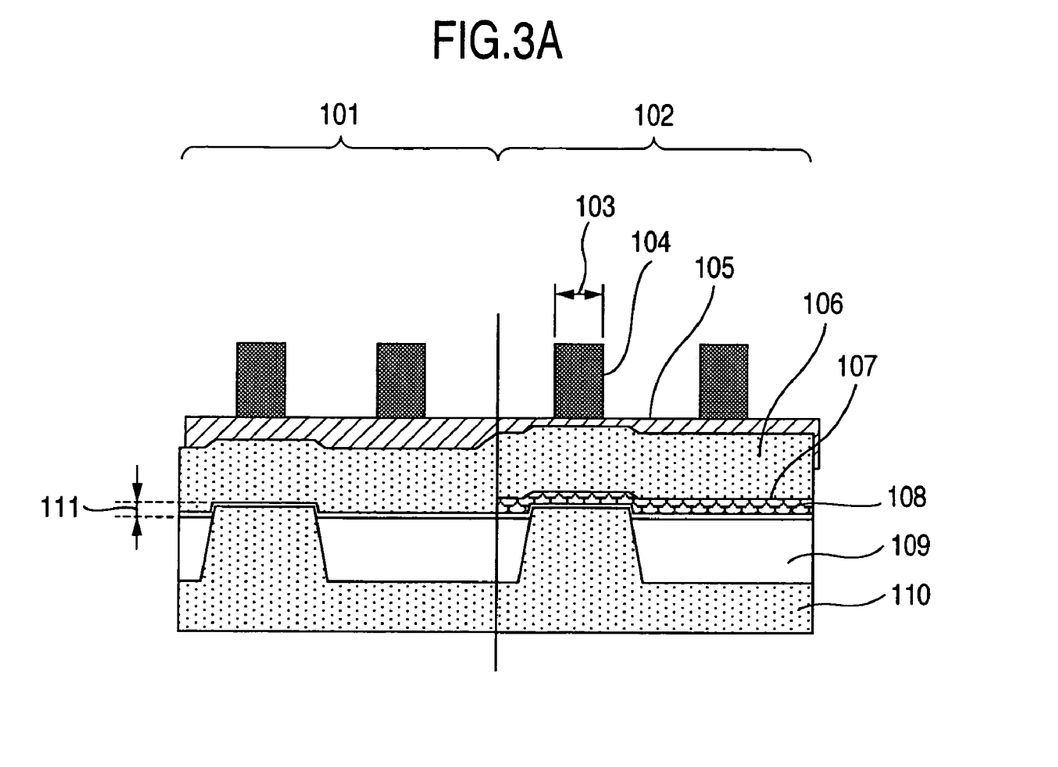
FIGS. 3A and 3B are diagrams each showing in cross-section an exemplary material being etched (sample No. 2).
Figure 3B:
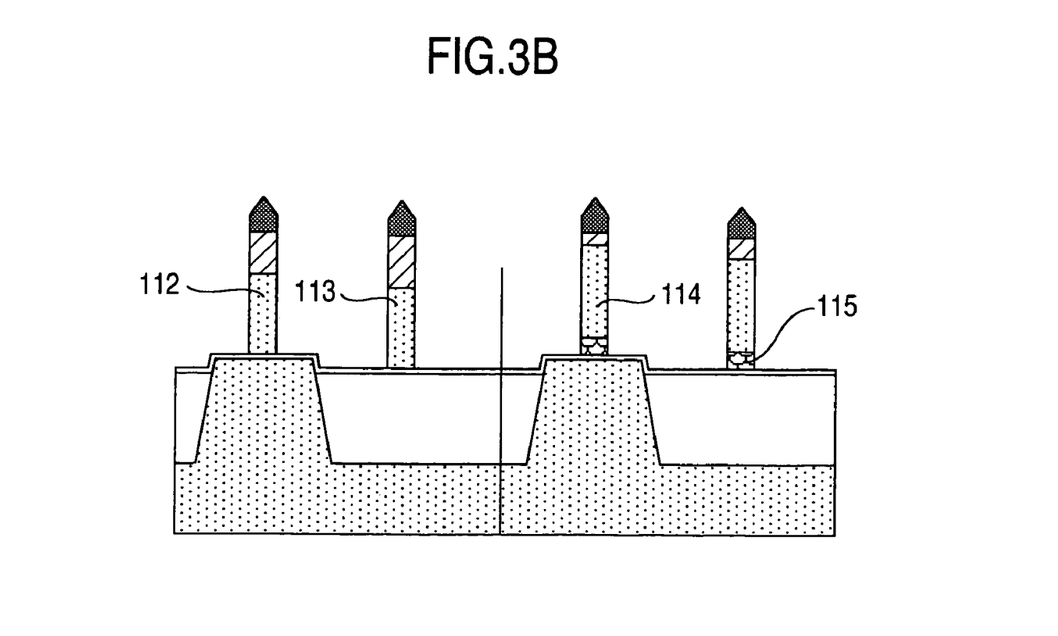

FIGS. 3A and 3B are cross-sectional diagrams each showing an example (sample No. 2) of the to-be-etched material which can be processed by the etching processing apparatus shown in FIG. 1. In this example, the sample No. 2 has a multilayer structure of a gate electrode film made of a transition metal material and its underlying insulative layer made of a high dielectric constant or "high-k" material. The structure is arranged so that the transition metal gate electrode material and the high-k material layer are mixed together on an etching surface.

As shown in FIGS. 3A-3B, the to-be-etched material has on a 8-inch Si wafer surface an NMOS gate part 101 and a PMOS gate part 102. This sample 2 was prepared in a way which follows.

First, an STI 109 is formed on a Si substrate 110. Then, after having formed an element isolation layer, a gate insulating film 108 made of HfSiON, HfSiO, $HfO_2$ or else is formed by atomic layer chemical vapor deposition (ALCVD)

techniques to a predetermined thickness of about 3 nm. Next, in order to selectively form TiN only at PMOS parts, a TiN layer 107 is deposited on an entire wafer surface to a thickness of about 20 nm; thereafter, a film of SiO$_2$-based hard mask is formed by lithography to thereby provide masking at PMOS parts, followed by wet removal of selected portions of the TiN layer at NMOS parts. After having formed on the entire wafer surface a poly-Si layer 106 to a thickness of about 100 nm, ion implantation is carried out to control the threshold voltage of a poly-Si electrode of each NMOS part. Thereafter, an organic antireflective film 105 is deposited and formed by spin coat techniques, followed by execution of ArF exposure for patterning an ArF resist 104 so that its resultant line size is 80 nm, or more or less.

The sample 2 that was formed in this way is then etched by using the etcher shown in FIG. 1. More specifically, in the state of a mixture of the transition metal element-containing electrode material layer (TiN layer) 107 and the high-dielectric-constant insulative material layer (HfSiON layer) 108, multi-step processing is done up to the etching of the TiN layer within the same chamber.

A procedure up to the overetching steps of antireflective film 105 and poly-Si layer 106 is similar to that in the case of the sample 1. During overetching of the poly-Si layer 106, the HfSiON layer 108 is exposed to a plasma at NMOS part 101 while the TiN layer 107 is exposed thereto at PMOS part 102. In such case, higher underlayer selectivity than that of the sample 1 is required.

Next, etch the TiN layer 107. An HCl gas is supplied at a flow rate of 50 to 150 ccm. The output power of UHF power supply 701 was set at 300 to 600W. The processing pressure was set at 0.1 to 0.4 Pa. The output power of RF bias power supply 713 was set at 5 to 15W. The lower-electrode temperature was set at 0 to 80 degrees. The three-stage electromagnet 704 is set so that its magnetic fluxes have an adequate distribution.

In order to reduce physical damages against the HfSiON layer 108 at NMOS part, the output power of RF bias power supply 713 is desirably less than or equal to 10W, which is a minimal output power that guarantees obtainability of TiN's vertical shapes. During overetching of TiN, it is possible by lowering RF bias to 0 to 5W to remove TiN 308 (residues) residing at the STI step-like difference portions 111 (corner edges) shown in FIG. 9. This makes it possible to vertically form the TiN gate electrode 114 at PMOS part 102. It is also possible to suppress surface roughness and/or pitting of HfSiON layer 108 at NMOS and PMOS parts.

In other words, in the case of etching samples having a dual metal-gate structure such as shown in FIG. 3A, the above-stated excellent etching results are achievable by setting the output power of RF bias power supply to 10W or below (in case the workpiece being etched is a 8-inch diameter wafer) upon execution of the main etching and letting the output power of RF bias power supply be 5W or less at the time the overetching is done.

Figure 4:
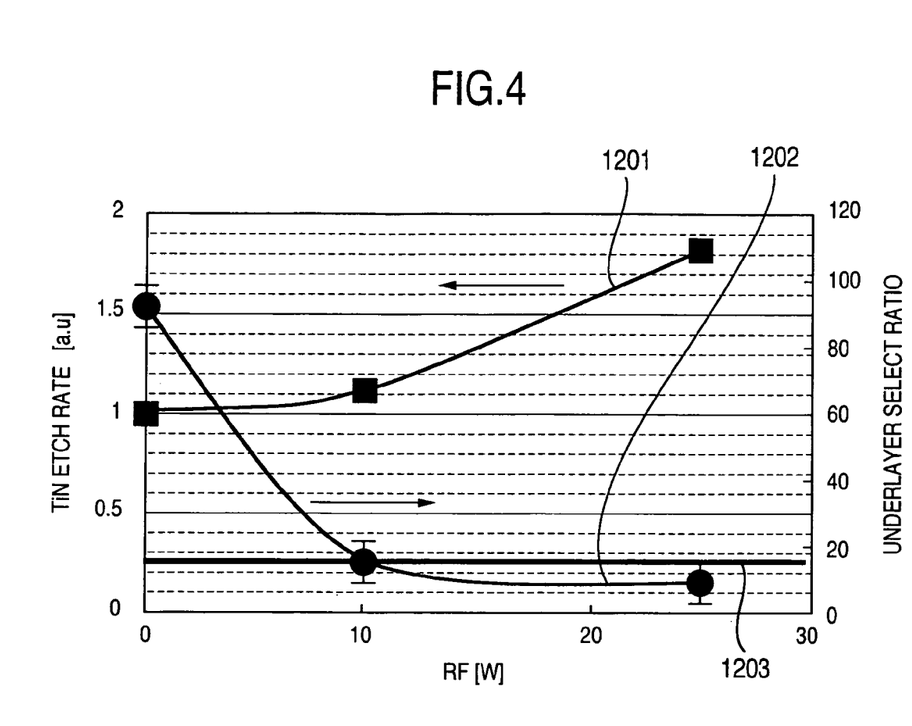
FIG. 4 is a diagram graphically showing RF bias dependency characteristics of the etching rate of a TiN layer and a selectivity to underlayer.

FIG. 4 is a graph showing RF bias dependency characteristics of the etching rate of TiN layer and the underlayer selectivity. As shown in FIG. 4, lowering the RF bias power supply output makes it possible to permit the underlayer selectivity indicated by curve 1202 (i.e., a ratio of TiN's etch amount to high-k film's etch amount) to be 15 or greater.

Obtaining the selectivity 15 indicates that in case TiN layer is 30 nm in thickness, its underlying high-k material is etched to a degree of 2 nm when performing the etching equivalent to 30 nm of the TiN layer (i.e., 100% overetching).

In addition, it becomes possible to reduce physical damages against the underlying high-k material or the ion-assisted etching yield, by lowering the RF bias output power and lessening the energy of incoming ions.

In this way, by lowering both the RF bias output power and the time average value of incoming ion energy, it became possible to suppress physical damages of the underlying high-k material and lessen the ion-assist etching yield.

Generally speaking, the time average value of the incoming ion energy varies depending on the frequency and waveform of an applied RF bias and the plasma conditions (including a plasma sheath thickness and a mean free path). In the plasma conditions (the RF bias power supply 713 used is designed to generate sine waves with a frequency of 400 kHz) during processing of the sample 2, the time average value of incident ion energy was 50V in case the RF bias output power is set to 10W, which is the minimum output power with obtainability of the above-noted TiN's vertical shape.

In other words, even with the conditions or control parameters which may give the time averaged incident energy of 50V or less, it is possible to obtain the intended etching results of TiN's vertical shape while at the same time suppressing physical damages against the HfSiON layer 108 at NMOS part in a similar way to the supply of an output power of 10W or less, which is the minimum RF bias output power with the capability to obtain the TiN's vertical shape.

This effect is also obtainable when using those materials that contain Ti, Ta, Ru or Mo, which is a transition metal material for forming similar chemical compounds to TiN. Although the high-k material film used may alternatively be a film made of SiO$_2$ or SiON, the effect is noticeable with respect to the case of a material which is higher in dielectric constant than SiO$_2$ and which is large in surface roughness even immediately after film fabrication and thus is difficult to take the underlayer selectivity, such as HfSiO or HfSiON or else.

In the case of metal gate CMOS fabrication, it is necessary to remove away the high-k material film after completion of the processing shown in FIG. 3B. To this end, a wet cleaning method or a method of combining together etching and wet cleaning processes is available. It is also permissible to do it as part of the multi-step processing in a single etching apparatus. In this case, it is required that the selectivity against the underlying Si substrate 110 be sufficiently acquirable. Etching conditions in this case are as follows: a BCl$_3$ gas is used; the output power of UHF power supply 701 is set at 300 to 600W; the processing pressure is set at 0.1 to 0.4 Pa; the output power of RF bias power supply 713 is set at 0 to 10W; the lower-electrode temperature is set at 0 to 80 degrees; and, the three-stage electromagnet 704 is set so that its magnetic fluxes have an adequate distribution.

FIGS. 5 and 6A-6C are diagrams for explanation of an example of the to-be-etched material (sample No. 3) which is processable by the etching processing apparatus shown in FIG. 1. In this example, the sample 3 has a three-dimensional (3D) TiN metal gate structure, as represented by fin-type field effect transistors (FIN-FET).

Figure 5:
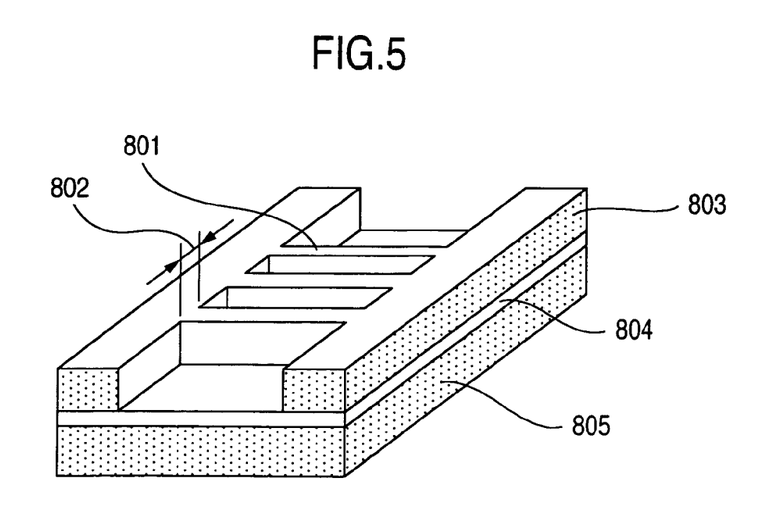
FIGS. 5 and 6A-6C are diagrams for explanation of an exemplary material being etched (sample No. 3).

When preparing the sample, firstly as shown in FIG. 5, form a plurality of spaced-apart parallel linear fin-like portions 801 on a surface of silicon-on-insulator (SOI) substrate, which is made up of a silicon (Si) layer 805 and its overlying Si layer 803 having a thickness of 10 to 80 nm with a 10 to 50 nm thick SiO$_2$ layer 804 being sandwiched therebetween. These fins 801 are formed by an etching technique similar to the STI etching so that each fin has a line size L of about 20 to 100 nm while setting a spacing S to a value that is three times greater than the fin width—that is, a ratio of the line size L to the spacing S is set at about 1:1 to 1:3. Then, those surfaces of the fins 801 corresponding to MOS channel regions are cleaned up by using cleaning in combination with annealing and sacrifice oxidation processes.

Thereafter, form a high-dielectric-constant or "high-k" material insulator film 809 to a thickness of 1.5 to 3 nm and a TiN layer 803 with a thickness of 30 to 80 nm. Then, deposit an organic antireflective film 902 of about 40 to 90 nm thick. Next, form a circuit pattern 901 through exposure using ArF photolithography apparatus or electron beam patterning/imaging equipment. Thus, a shape shown in FIG. 6A is obtainable.

Figure 6A:
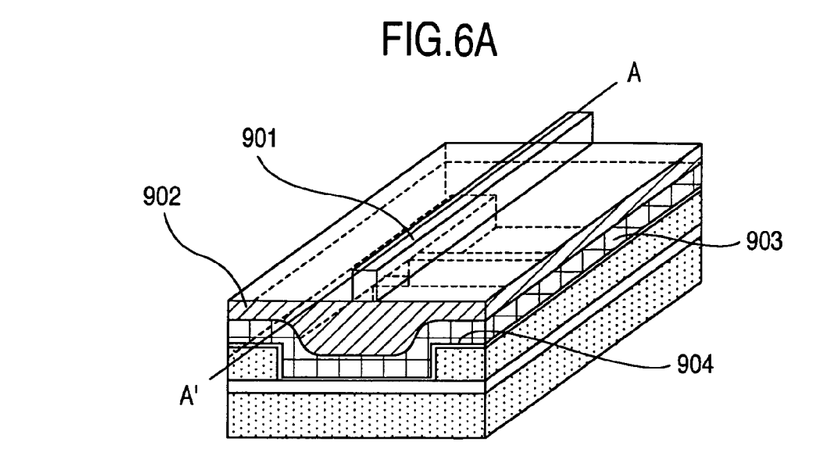
Figure 6B:
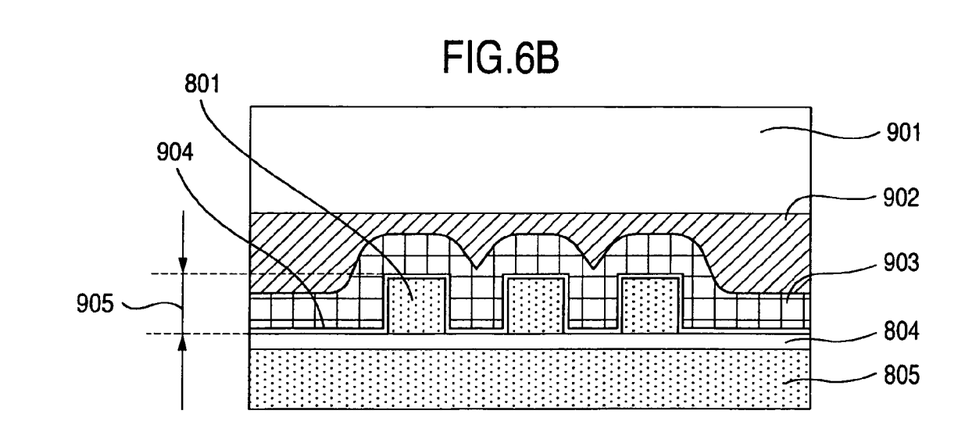

A cross-section taken along a parallel plane containing a line A-A' of FIG. 6A is shown in FIG. 6B. As shown in FIG. 6B, the sample 3 of FIN-FET device in this example has no STI step difference 111 such as those in the above-stated examples but exhibits creation of step-like differences at the fin portions 801 due to the fact that this sample uses the SOI substrate. Thus, overetching to a degree equivalent to this step difference is required at the very least. For example, in case a height 905 of the fins 801 is 40 nm and the TiN layer 903 is 30 nm thick, overetching of about 130% is needed.

When etching the sample 3 shown in FIG. 6A, first etch the antireflective film 902 in a similar way to the case of etching the sample 1; thereafter, etch the TiN layer 903.

When etching the TiN layer (main etching), an HCl gas is supplied at a flow rate of 50 to 150 ccm. The output power of UHF power supply 701 was set at 300 to 600W while setting the processing pressure at 0.1 to 0.4 Pa, the output power of RF bias power supply 713 at 5 to 15W, and the lower-electrode temperature at 0 to 80 degrees. The three-stage electromagnet 704 was set so that its magnetic fluxes have an adequate distribution. Then, after having detected an end point of the main etching by optical emission spectroscope analysis, switch it to an overetching step.

Overetching conditions are as follows. An HCl gas is fed at a flow rate of 50 to 150 ccm. The output power of UHF power supply 701 was set at 300 to 600W while setting the processing pressure at 0.1 to 2.0 Pa, the output power of RF bias power supply 713 at 0 to 5W, and the lower-electrode temperature at 0 to 80 degrees.

Figure 6C:
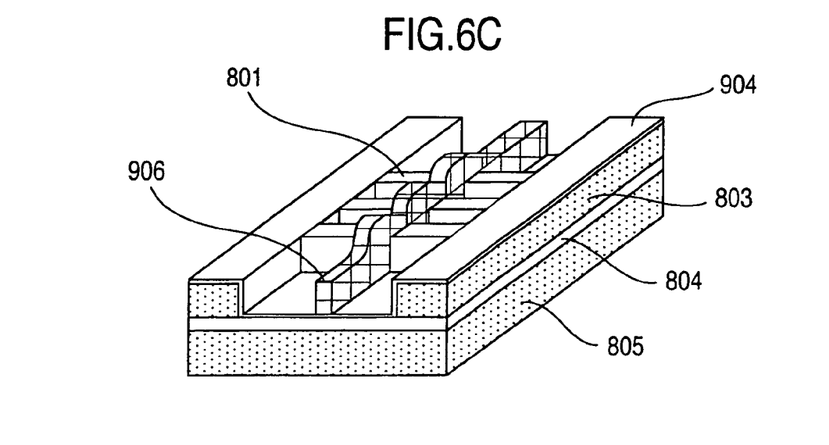

Owing to the end point detection, it is possible to perform switching from the main etching to the overetching at an accurate timing. Furthermore, by letting the RF bias during overetching be 5W or less, it is possible to form a TiN gate electrode 906 above the fins 801 without suffering from occurrence of underlayer dislocations with respect to the underlying layer (high-k material layer) even after having applied 130% overetching to the TiN layer 903.

Figure 7A:
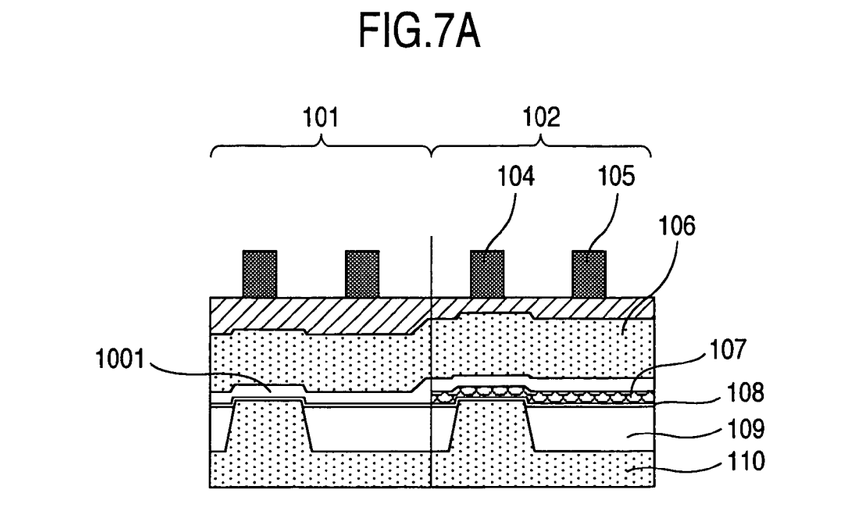
FIGS. 7A-7C are diagrams for explanation of an exemplary material being etched (sample No. 4).
Figure 7B:
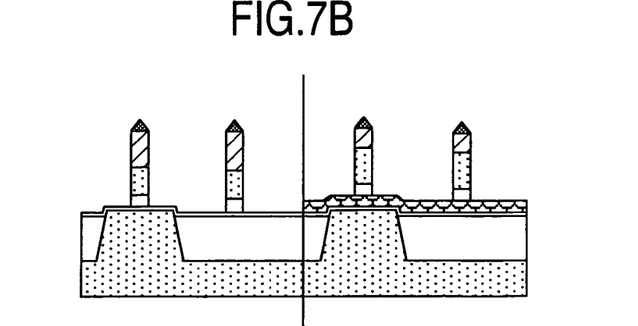
Figure 7C:
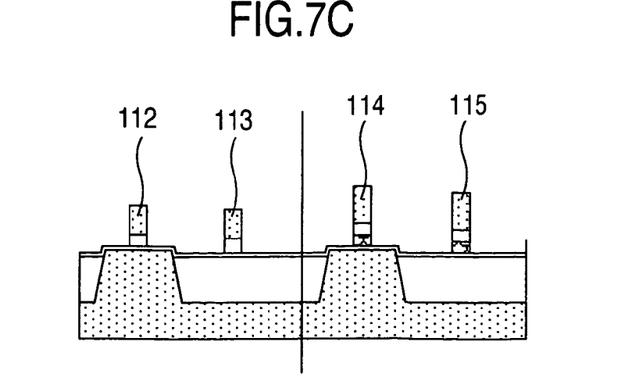

FIGS. 7A-7C are diagrams showing, in cross-section, a to-be-etched material example (sample No. 4) capable of being processed by the etcher of FIG. 1. In this example, a TaSiN layer is used as the transition metal element-based gate electrode material.

When preparing this sample 4 shown in FIG. 7A, first an STI 109 is formed on a Si substrate 110 of 8-inch diameter. After having formed an element isolation layer, a layer of high-dielectric-constant insulative material such as HfSiON, HfSiO, HfO$_2$ or else is formed by ALCVD as a gate insulator film 108 of about 3 nm thick. Then, in order to form a TiN film only at PMOS part 102, a TiN layer 107 is deposited on an entire wafer surface to a thickness of about 10 to 20 nm; thereafter, a film of SiO$_2$-based hard mask is formed, followed by masking of PMOS part 102 using lithography and then by wet removal of selected portions of the TiN layer at NMOS part 101. After having formed on or above the entire wafer surface a TaSiN layer 1001 and poly-Si layer 106 to a thickness of about 100 nm, ion doping or implantation is done to thereby control the threshold voltage of a poly-Si electrode at NMOS part 101. Thereafter, an organic antireflective film 105 is formed and deposited by spin coat techniques. Then, perform patterning by ArF exposure to an extent that an ArF resist 104 is about 80 nm in its line size 103.

The sample 4 thus formed in the way stated above is then etched by use of the etcher tool shown in FIG. 1. More specifically, in the state of a mixture of transition metal element-containing electrode material layer (TiN layer) 107 and high-dielectric-constant insulative material layer (HfSiON layer) 108, multi-step processing is done up to the etching of the TiN layer within the same chamber.

First etch the antireflective film 105 by a similar method to that in the case of the sample 1; then, apply main etching and overetching to the poly-Si layer 106. Thereafter, add a pure HCl gas or an HCl/HBr mixture gas to a TaSiN layer 1001 and TiN layer 107. Next, etching treatment (main etching and overetching) is performed while setting the output power of UHF power supply 701 was set at 300 to 800W, the processing pressure at 0.2 to 0.6 Pa, the output power of RF bias power supply 713 to 5 to 20W, and the lower-electrode temperature at 0 to 80 degrees, with magnetic fluxes of the three-stage electromagnet 704 being set to have an adequate distribution.

Although appreciable effect is exhibited when the processing gas is an HCl gas only, side-etch is occurrable depending on the Si content of the TaSiN layer 1001. In such case, it is recommendable to add HBr thereto within a range of 80% or below. Adding HBr makes it possible to achieve both the shape verticality and the underlayer selectivity at a time. It should readily occur to those skilled in the art that a step separation technique is employable while using different kinds of gases in accordance with the material composition and film quality required, in such a way that the TaSiN layer 1001 is etched by using a mixture gas of HCl and HBr whereas the TiN layer 107 is etched using the HCl gas only.

In the case of metal gate CMOS formation, a need is felt to remove the high-k material film after completion of the processing shown in FIG. 7C. Etching conditions in this case are as follows: a BCl$_3$ gas is supplied; the output power of UHF power supply 701 is set to 300 to 600W; the processing pressure is set at 0.1 to 0.4 Pa; the output power of RF bias power supply 713 is 0 to 10W; the lower-electrode temperature is 0 to 80 degrees; and, the three-stage electromagnet 704 is set so that its magnetic fluxes have an adequate distribution.

With the processing stated above, it was possible to successfully form TaSiN at NMOS part 101 and TiN gate electrode 114 at PMOS part 102 with good verticality while letting them be free from surface roughness risks. It was revealed that this effect is also obtainable in terms of material that contains a transition metal such as Ta or Mo, which forms similar chemical compounds to TiN.

As stated supra, the illustrative embodiments are designed to use not Cl$_2$ but HCl as a main gas of the etching gas. This enhances the selectivity relative to the underlying high-k material during etching of the transition metal element-containing electrode material layer, which in turn makes it possible to process the electrode material with increased accuracy. In other words, eliminating the use of a Cl$_2$ gas (or suppressing its use amount) enables restraint of occurrence of needle-like residues or surface roughness of the electrode material that contains therein a transition metal (such as Ti, Ta, Ru, Mo or else). It is also possible to preclude surface roughness and underlayer dislocations otherwise occurring due to generation of a local difference in overetching amount with respect to the underlying high-k material layer.

Additionally at the time the HCl gas is used, it becomes possible to apply to the TiN layer the overetching of more than 75% relative to the TiN layer thickness under low-bias conditions with the RF bias being set to 10W per 8-inch wafer diameter (30 mW/cm$^2$). It has been affirmed that these effects are attainable even in the case of using materials containing therein a transition metal such as Ta or Mo, which are expected to form chemical compounds similar in nature to TiN, and Hf-containing high-k materials.

Thus it becomes possible to fabricate, with increased accuracy, metal gate structured CMOS transistor devices of the type having a transition metal-containing gate electrode material (TiN, TaN, TaSiN or Mo) which is formed on or above the high-k material layer (HfSiON, HfSiO, HfO$_2$ or equivalents thereto).

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma etching method in manufacturing a MOS transistor, a workpiece being placed on a lower electrode located in a vacuum processing vessel, said workpiece having a lamination of (a) a layer for a gate electrode for said MOS transistor, said layer containing therein a transition metal element, and (b) an underlying dielectric material layer made of a high dielectric constant insulator, to form a metal gate structure for said MOS transistor, comprising:

while introducing a processing gas into said vacuum processing vessel and supplying high-frequency electrical power to inside of said vacuum processing vessel, performing plasma conversion of the processing gas introduced to thereby etch a surface of said workpiece, said processing gas including hydrogen chloride;

performing a main etching process to etch a part of the layer for the gate electrode for said MOS transistor on said underlying dielectric material layer, with applying a first power of RF bias to said lower electrode; and performing an overetching process to etch the layer for the gate electrode for exposing said underlying dielectric material layer, with applying a second power of RF bias to said lower electrode, wherein said second power is equal to or less than said first power, in milliwatts per square centimeter, so as to enhance the selectivity of etching the layer for the gate electrode relative to etching the underlying dielectric material layer.

2. The plasma etching method according to claim 1, wherein said first power, in milliwatts per square centimeter, is 30 milliwatts per square centimeter (mW/cm$^2$).

3. The plasma etching method according to claim 1, wherein an average energy of ions falling onto the workpiece surface above said lower electrode, during the overetching, is 50 volts (V) or less.

4. The plasma etching method according to claim 1, wherein said layer for the gate electrode containing the transition metal element comprises any one selected from the group consisting of titanium (Ti), tantalum (Ta), ruthenium (Ru) and molybdenum (Mo).

5. The plasma etching method according to claim 1, wherein said dielectric material layer containing the high dielectric constant insulator comprises any one selected from the group consisting of hafnium (Hf) and silicon (Si).

6. The plasma etching method according to claim 1, wherein said second power, in milliwatts per square centimeter, is a level of power, less than said first power, so as to restrain damage of the etched surface as compared to where a level of power is greater than said first power, in milliwatts per square centimeter.

7. The plasma etching method according to claim 1, wherein both a PMOS transistor and an NMOS transistor, of CMOS structure, are manufactured in said manufacturing a MOS transistor, and wherein the introduction of said processing gas and said supplying high-frequency electrical power, said performing plasma conversion and said performing the said main etching process and said overetching process, etch layers for the gate electrodes of both said PMOS transistor and said NMOS transistor.

8. The plasma etching method according to claim 1, wherein said plasma conversion of a processing gas, including hydrogen chloride, is performed both to thereby perform the main etching process and the overetching process.

* * * * *